United States Patent [19]

Fujimoto et al.

[11] Patent Number: 4,984,056
[45] Date of Patent: Jan. 8, 1991

[54] SEMICONDUCTOR INTEGRATED CIRCUIT DEVICE

[75] Inventors: Hitoshi Fujimoto; Kiyoaki Tsumura, both of Itami, Japan

[73] Assignee: Mitsubishi Denki Kabushiki Kaisha, Japan

[21] Appl. No.: 450,455

[22] Filed: Dec. 14, 1989

[30] Foreign Application Priority Data

Oct. 13, 1989 [JP] Japan .................. 1-265135

[51] Int. Cl.$^5$ .............................. H01L 23/48
[52] U.S. Cl. ........................ 357/67; 357/71; 357/68
[58] Field of Search ............ 357/71, 68, 52, 23.15, 357/67

[56] References Cited

U.S. PATENT DOCUMENTS

| 3,879,746 | 4/1975 | Fourier | 357/23.15 |
| 4,811,076 | 3/1989 | Tigelaar et al. | 357/71 |
| 4,811,078 | 3/1989 | Tigelaar et al. | 357/67 |
| 4,855,801 | 8/1989 | Kuesters | 357/54 |
| 4,890,141 | 12/1989 | Tang et al. | 357/23.3 |
| 4,903,110 | 2/1989 | Aono | 357/51 |
| 4,914,500 | 4/1990 | Liu et al. | 357/67 |

FOREIGN PATENT DOCUMENTS 63-036569 2/1988 Japan .
63-144558 6/1988 Japan .

Primary Examiner—Andrew J. James
Assistant Examiner—Dang Xuan Huang
Attorney, Agent, or Firm—Leydig, Voit & Mayer

[57] ABSTRACT

A semiconductor integrated circuit device includes a tetraethylorthosilicate film between a TiN film and a field oxide film disposed. This structure greatly reduced the possibility of separation of films in the bonding structure and contact failure as part of a wire bonding structure.

3 Claims, 1 Drawing Sheet

SEMICONDUCTOR INTEGRATED CIRCUIT DEVICE

DETAILED DESCRIPTION OF THE INVENTION

1. Field of the Invention

The present invention relates to a semiconductor integrated circuit device, particularly to the structure of the bonding pad of a semiconductor device formed on the surface of a semiconductor substrate which can be wire bonded stably at the time of interconnection wire bonding and which has a highly reliability connection.

2. Description of the Related Art

In a semiconductor device formed on a semiconductor substrate, a plurality of bonding pads, one side of which is 100 μm or thereabouts, are formed on the surface of the substrate. The bonding pads and external leads are interconnected using gold wires or aluminum wires.

Recent semiconductor integrated circuit devices operate at high speed and their patterns are refined. An example of the semiconductor integrated circuit device is shown in FIG. 1.

FIG. 1 is a cross sectional view illustrating the basic structure of an ordinary bonding pad in a dynamic memory in a conventional semiconductor integrated circuit device, for example, that shown in Japanese Published Patent Application 64-37031. In the figure, a field oxide film 2, e.g., a $SiO_2$ film, is formed on a semiconductor substrate 1, and on this field oxide film 2 is formed a polysilicon film (poly-crystalline silicon) 3. A silicide film of a high melting point metal, e.g., a tungsten silicide (WSi) film 4, is formed on the polysilicon film 3. A composite film which is composed of a combination of the polysilicon film 3 and the tungsten silicide film 4 is called a polycide film, and serves as a gate electrode material. A boron phosphorus silicate glass film (hereinafter referred to as BPSG film) 5, which is an interlayer insulating film reducing the corrosion of a fine metal wire 9 with improved moisture resistance, is formed on the field oxide film 2 covering the polycide film. Next, only those parts of the BPSG film 5 covering the polycide film are removed by etching Further, a TiN (titanium nitride) film 6, which is a barrier metal, is adhered on the tungsten silicide film 4. The TiN film 6 improves the characteristics of a circuit element. In addition, it extends the time until a disconnection occurs due to the deterioration of a metal connection between the bonding pad 7 and the metal fine wire 9 to be described later, and prevents the precipitation of an impurity metal from the fine metal wires 9. On the TiN film 6 the bonding pad 7, for example, an aluminum film is formed. An insulating protective film 8 is adhered on the bonding pad 7. The portion which becomes the bonding pad 7 is opened, i.e., film 8 is removed and its surrounding remains covered by film 8. The bonding pad 7 and the external leads (not shown) are connected by means of the fine metal wire 9, for example, a gold wire.

A conventional semiconductor integrated circuit device has such a configuration as that described above. The wire bonding connecting the bonding pad 7 and the metal wire 9 is performed as follows. First, the melted metal wire 9 is contacted to the tip of a capillary tube (not shown). The tip of the metal wire 9 is pressed against the bonding pad 7 using the capillary tube. An ultrasonic oscillation is applied to the capillary tube itself. By applying weight, the bonding pad 7 and the metal wire 9 are connected by diffusion.

In the basic bonding pad structure as described above, the contact between the tungsten silicide film 4 and the polysilicon film 3 after the wire bonding is poor, and residual stress developed in a high-temperature heat treatment process is exerted. For this reason, there has been a problem that a separation, i.e., a pad separation, occurs between the films 3 and 4.

SUMMARY OF THE INVENTION

The present invention has been devised to solve the above-described problems. An object of the invention is to produce a semiconductor integrated circuit device preventing pad separation and having a bonding pad structure that prevents a reduction in the lifetime of the device due to the deterioration of the connection.

To this end, according to the present invention, there is provided a semiconductor integrated circuit device comprising a semiconductor substrate, a field oxide film formed on the semiconductor substrate, an insulating film formed on the field oxide film, a tetraethylorthosilicate film formed on the insulating film, a titanium nitride film formed on the tetraethylorthosilicate film, a bonding pad formed on the titanium nitride film, and an electrically insulating protective film formed on the tetraethylorthosilicate film covering the sides of the titanium nitride film and the bonding pad on the upper surface of the bonding pad.

DESCRIPTION OF THE PREFERRED EMBODIMENTS

Figure 1:
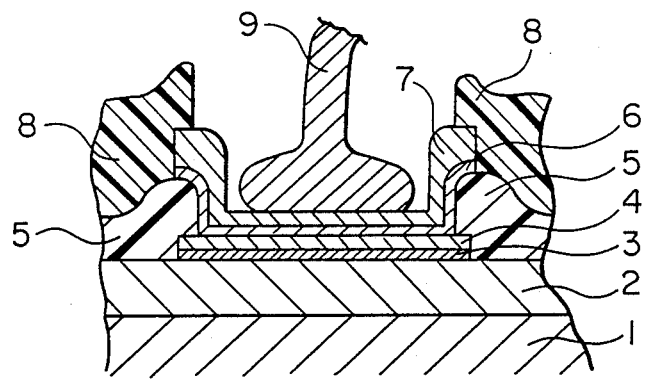
FIG. 1 is a cross section illustrating the basic structure of a bonding pad in a conventional semiconductor integrated circuit device.
Figure 2:
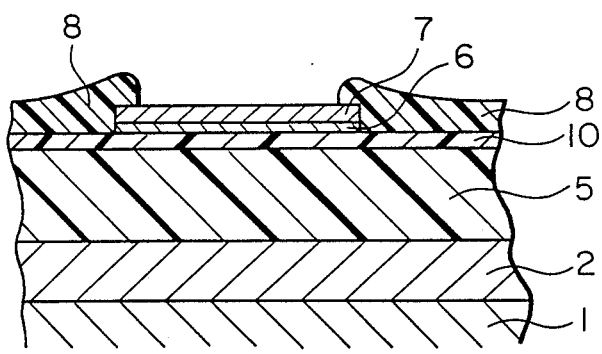
FIG. 2 is a cross section illustrating the basic structure of a bonding pad in the semiconductor integrated circuit device in accordance with an embodiment of the invention.

FIG. 2 is a cross-sectional view illustrating a bonding pad in a semiconductor integrated circuit device in accordance with an embodiment of the invention. The elements numbered 1, 2, 5, and 6 to 8 are the same as for the conventional semiconductor integrated circuit device described above. In FIG. 2, the field oxide film 2 is formed on the semiconductor substrate 1, and on this field oxide film 2 is formed an interlayer insulating film, e.g., a BPSG film 5. A tetraethylorthosilicate film (hereinafter referred to as TEOS film) 10 grown from liquid tetraethylorthosilicate is formed on the BPSG film 5. The TiN film 6 having nearly the same circumference as that of the bonding pad 7 is deposited on the TEOS film 10. Furthermore the bonding pad 7 is deposited on this TiN film 6. The TiN film 6 and the bonding pad 7 are patterned to a predetermined shape, after which an insulating protective film 8 is deposited on the bonding pad 7. Next, an upper portion of the insulating protective film 8 is removed by etching to expose the surface of but cover the side of the bonding pad 7. Following this, in the same manner as for a conventional semiconductor integrated circuit device, the bonding pad 7 and the metal fine wire (not shown) are bonded.

In the semiconductor integrated circuit device arranged as described above, the TEOS film 10 is interposed between the BPSG film 5 and the TiN film 6, so the degree of contact between these films can be greatly increased. Accordingly, separation of the bonding pad 7 after wire bonding is prevented, improving yield. Furthermore, pad separation can be prevented, thereby preventing deterioration of the connection.

We claim:

1. A semiconductor integrated circuit device comprising:
    a semiconductor substrate;
    an oxide film disposed on said semiconductor substrate;
    an insulating film disposed on said oxide film;
    a tetraethylorthosilicate film disposed on said insulating film;
    a titanium nitride film disposed on said tetraethylorthosilicate film;
    a bonding pad disposed on said titanium nitride film; and
    an insulating protective film disposed on said tetraethylorthosilicate film.

2. A device as claimed in claim 1 wherein said insulating film is boron phosphorus silicate glass.

3. A device as claimed in claim 1 wherein said bonding pad has a surface to which a wire may be bonded, said bonding pad and titanium nitride film have sides transverse to the surface, said insulating protective film covers the sides of said bonding pad and said titanium nitride film, and the surface of said bonding pad is exposed.